United States Patent [19]
Uchiyama et al.

[11] Patent Number: 5,555,634
[45] Date of Patent: Sep. 17, 1996

[54] WAFER HOLDER

[75] Inventors: Isao Uchiyama; Hideo Kudo, both of Fukushima-ken, Japan

[73] Assignee: Shin-Etsu Handotai Co., Ltd., Japan

[21] Appl. No.: 358,112

[22] Filed: Dec. 16, 1994

[30] Foreign Application Priority Data

Jan. 18, 1994 [JP] Japan .................... 6-003354

[51] Int. Cl.⁶ .................................. F26B 21/06
[52] U.S. Cl. ................... 34/78; 34/239; 211/41; 414/935
[58] Field of Search ................. 34/78, 239, 77, 34/73; 414/935, 941; 211/41

[56] References Cited

U.S. PATENT DOCUMENTS

| | | | |
|---|---|---|---|
| 4,777,970 | 10/1988 | Kusuhara | 34/78 |
| 4,858,764 | 8/1989 | Domokos | 211/41 |
| 5,191,908 | 3/1993 | Hiroe et al. | |

FOREIGN PATENT DOCUMENTS

| | | | |
|---|---|---|---|
| 2567160 | 7/1984 | France. | |
| 14237 | 1/1992 | Japan | 414/935 |

OTHER PUBLICATIONS

IBM Technical Disclosure Bulletin, vol. 18, No. 12, May 1976; "Repeatedly Oriented, Univeersal Wafer Chuck"; G. W. Ringel; pp. 4086–4087.

Primary Examiner—F. Daniel Lopez
Attorney, Agent, or Firm—Whitham, Curtis, Whitham & McGinn

[57] ABSTRACT

A wafer holder for handling wafers, particularly during a vapor drying process during automated wafer processing, provides for change of the diameter of the wafers to be held without replacement of one wafer holder with another in a wafer processing apparatus. The wafer holder is a unitary structure having a plurality of wafer holding portions, each wafer holding portion having a geometry appropriate to a single wafer diameter which differs from the diameter of wafers to be held by other wafer holding portions of the unitary structure. The wafer holder is preferably secured onto a robot arm in the wafer processing apparatus and can be rotated in orientation by a mechanical linkage in the robot arm in order to receive and hold wafers of a specific diameter being processed in the wafer processing apparatus at any given time. When wafers of another, different, diameter are to be processed, the unitary structure is rotated, preferably in an automatic fashion, to rapidly present a geometry of another wafer holder portion appropriate to the new wafer diameter by bringing the wafer holder to a changed orientation.

17 Claims, 9 Drawing Sheets

WAFER HOLDER

BACKGROUND OF THE INVENTION

1. Field of the Invention

The present invention relates to a wafer holder which is capable of handling semiconductor wafers (hereafter referred simply to as wafers) of any of selected different diameters and an apparatus for vapor-drying wafers using the wafer holder.

2. Description of the Prior Art

In semiconductor device fabrication processes, impurities and foreign matter adhered on the surface of a wafer have an adverse influence on the performance of semiconductor devices therefrom.

A cleaning operation is therefore indispensable in processes for producing wafers. And there are available a variety of cleaning methods in the cleaning operation for a process for producing wafers, which are most broadly classified into the two groups of physical methods and chemical methods.

In the physical methods, included are a method in which impurities stuck on the surface of a wafer are directly removed by the mechanical action of a washing brush, another method in which a pressurized liquid is shot in a stream onto part or all of the surface of a wafer from a jet nozzle and thereby the impurities are removed and still another method in which impurities stuck on the surface of a wafer are removed by application of ultrasonic waves (which is a so-called ultrasonic cleaning method).

In the chemical methods, impurities stuck on the surface of a wafer are chemically decomposed into constituents to be removed by the powers of chemicals or enzymes. Mechanical and chemical methods may be combined so as to improve the total cleaning capacity.

In the practical application of the above-mentioned cleaning methods, two types of transportaion of wafers are known for feeding them into the cleaning means, in one of which a plurality of wafers are accommodated in a carrier cassette made from plastics for transportation (carrier type) and in the other of which a wafer(s) is grasped by a robot hand and so on for transportation (carrier-less type).

A cleaning apparatus of the carrier type has a demerit that wafers are by chance polluted by adhesion of particles or the like, which may be generated by friction between some of the wafers and the carrier cassette, but has a merit that wafers of different diameters are easier to handle in the same cleaning apparatus by exchange of carrier cassettes in dependence on a selected diameter thereof.

While the cleaning apparatus of the carrier-less type does not have a demerit of wafer-pollution caused by a carrier cassette, but has a great difficulty of constraint originating from the structures themselves of both a wafer holder used within a cleaning bath and a robot hand for transportation of wafers.

In a drying apparatus corresponding to the above-mentioned cleaning apparatus of the carrier-less type, it is also necessary for a similar reason to the great difficulty from the structures that when the same drying apparatus handles wafers of different diameters a wafer holder and/or a robot hand for transportation of wafers are exchanged in dependence on selected diameters thereof or in another case a cleaning device and drying device are selected to match the respective diameters and thus the efficiency of operation thereof is reduced to a great extent.

SUMMARY OF THE INVENTION

The present invention was made in view of the prior art technology above-mentioned and has an object to provide a wafer holder suitable for handling wafers of any of selected different diameters. The present invention has another object to provide an economically excellent apparatus for vapor-cleaning wafers which is capable of drying wafers of different diameters in the same drying apparatus instead of in a plurality of the drying apparatuses each specialized for wafers of a diameter, when wafers of different diameters are cleaned in an apparatus for cleaning wafers and thereafter dried in a carrier-less mode with vapor generated by heating a solvent.

The wafer holder according to the present invention has a plurality of wafer holding means in one united body, each of which is pivotably secured at the fore end of a robot hand and which may hold a plurality of wafers of one of selected different diameters at a time, where the wafer holding means are interchangeable with each other by rotating a plurality of the wafer holding means as a whole to accommodate wafers of a desired different diameter in dependence on selection of the desired diameter of wafers to be held.

The apparatus for vapor-drying wafers according to the present invention is one in which wafers cleaned in an cleaning apparatus are dried in a cassette-less mode with vapor generated by heating a solvent and which comprises a vapor-drying bath, a robot hand shiftable upward or downward and secured above the bath, and a wafer holder being capable of holding a plurality of wafers of any of selected different diameters which is secured at the fore end of the robot hand.

Solvents that may be used in the apparatus for vapor-drying wafers according to the present invention include isopropyl alcohol (hereafter referred to as IPA), which is preferable, and other volatile liquids such as ethanol, methanol, acetone, Freon (the trade mark of E.I. du Pont de Nemours and Company), mixtures of Freon and any of a group consisting of ethanol, methanol, acetone and IPA, methylene chloride, trichloroethane, trichloroethylene, chloroform, trichlorofluoroethane and the like.

The wafer holder according the present invention is adaptable for in-situ free selection of a desired diameter out of selected different diameters of wafers to be held and thus vapor-drying is efficiently carried out therewith.

BRIEF DESCRIPTION OF THE DRAWINGS

Other features and objects of the present invention will become apparent from a study of the following description of a wafer holder which is capable of handling wafers of any of selected different diameters and an apparatus for vapor-drying wafers using the wafer holder together with the accompanying drawings, of which.

DETAILED DESCRIPTION OF THE PREFERRED EMBODIMENTS

Below described in reference to the drawings is an embodiment of the present invention.

Figure 1:
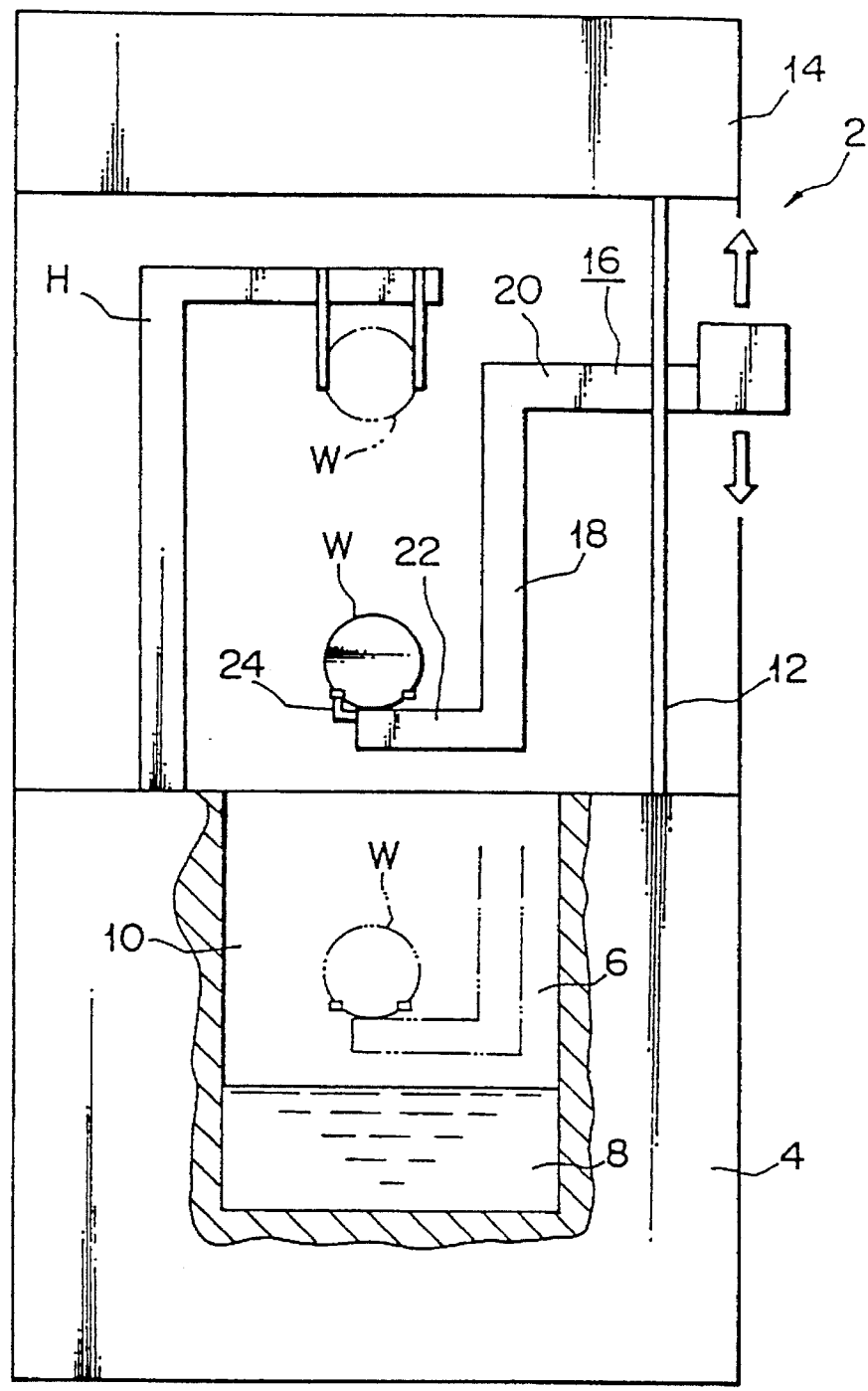
FIG. 1 is a schematic side elevational view illustrating an embodiment of the apparatus for vapor-drying wafers according to the present invention.
Figure 2:
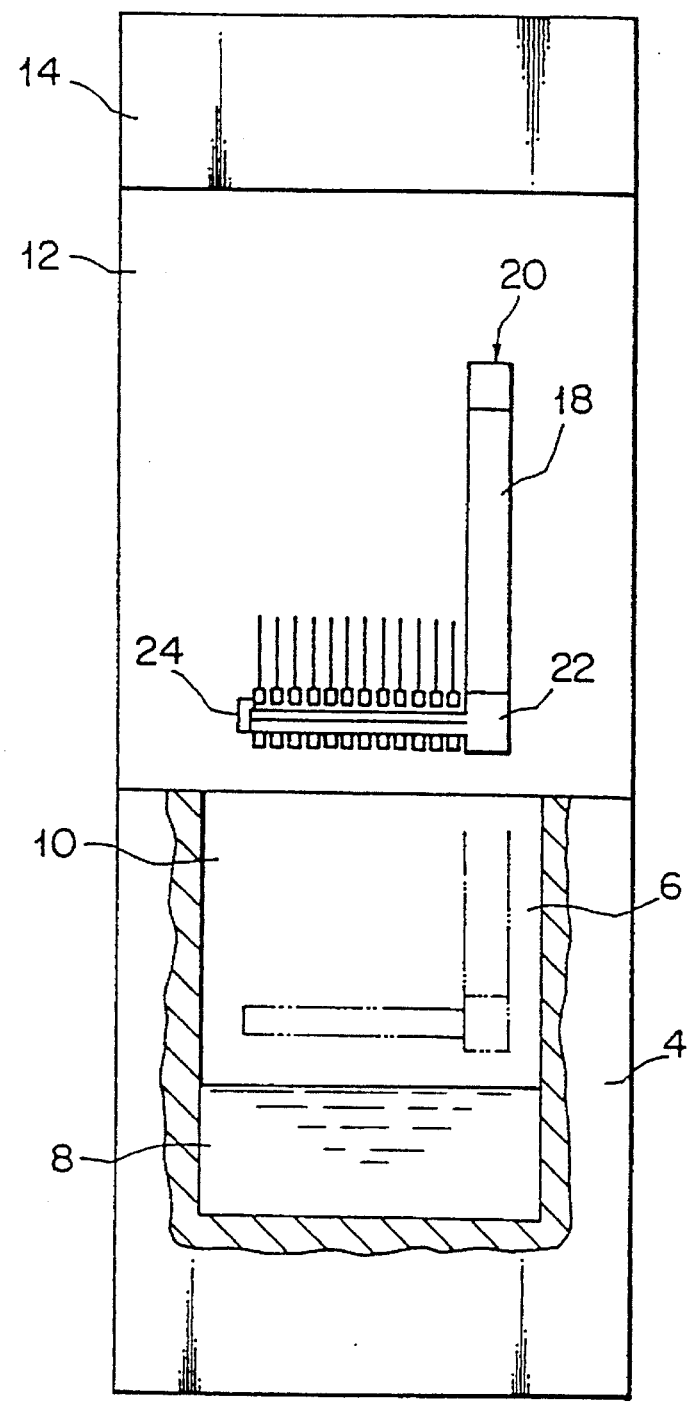
FIG. 2 is a schematic front elevational view illustrating an embodiment of the apparatus for vapor-drying wafers according to the present invention.
Figure 3:
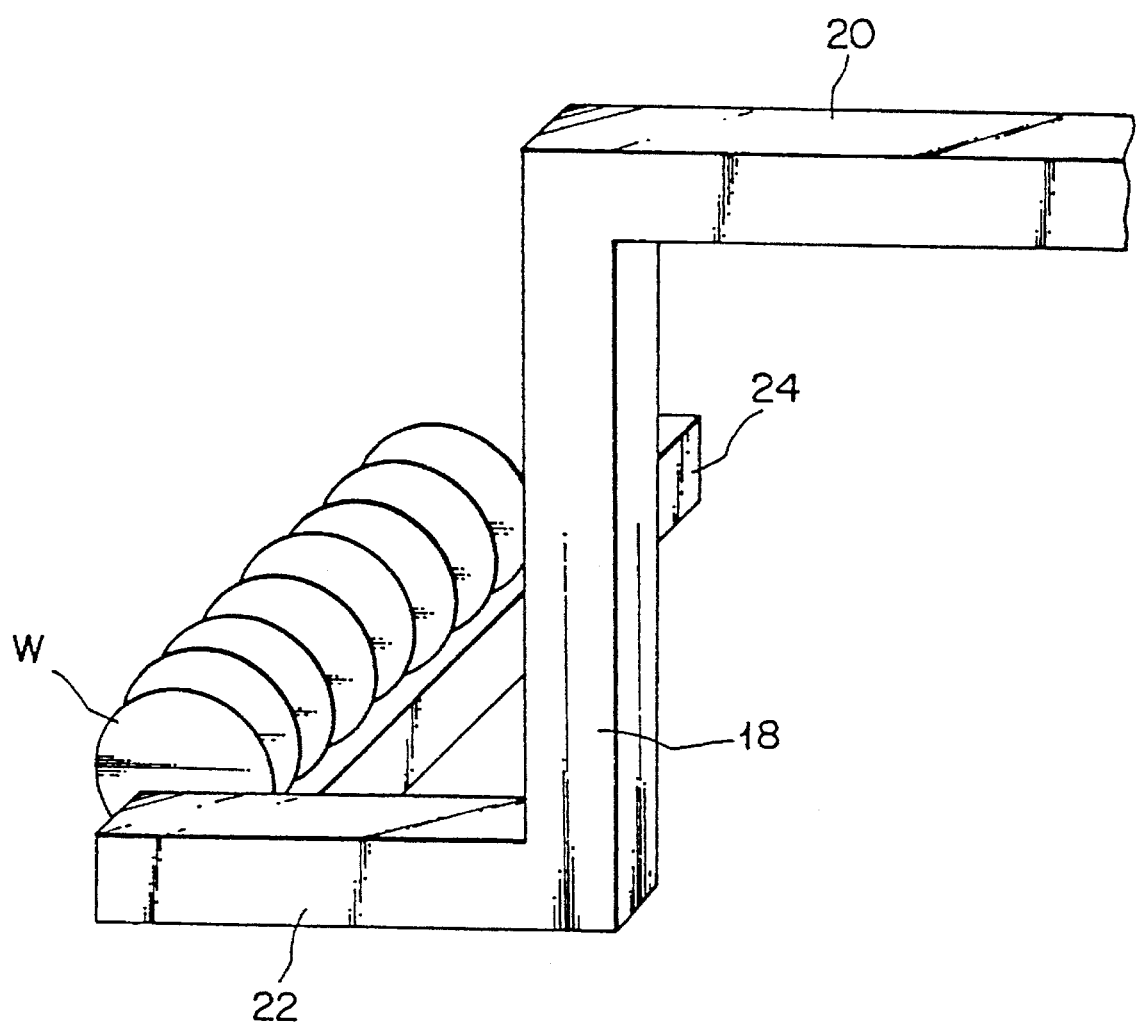
FIG. 3 is a schematic perspective view illustrating an embodiment of the apparatus for vapor-drying wafers according to the present invention.

In FIG. 1, the reference numeral 2 indicates an apparatus for vapor-drying wafers (where an so-called IPA vapor-drying apparatus is taken as an example). The apparatus for vapor-drying wafers 2 has an IPA vapor-drying bath 6 supported on a base frame 4, in the interior of which IPA liquid 8 is accommodated and an IPA vapor zone is formed by IPA vapor vaporized from the IPA liquid 8. The reference mark H indicates a robot arm for transportation of wafers.

On the base frame 4, there is provided a support frame 12, at the upper end of which an upper frame 14 is disposed. The reference numeral 16 indicates a robot arm for drying 16 comprising a vertical hollow arm 18, an upper horizontal hollow arm 20 which extends outwardly at the upper end of the vertical arm 18 and a lower horizontal hollow arm 22 which extends inwardly at the lower end of the vertical arm 18.

Figure 4:
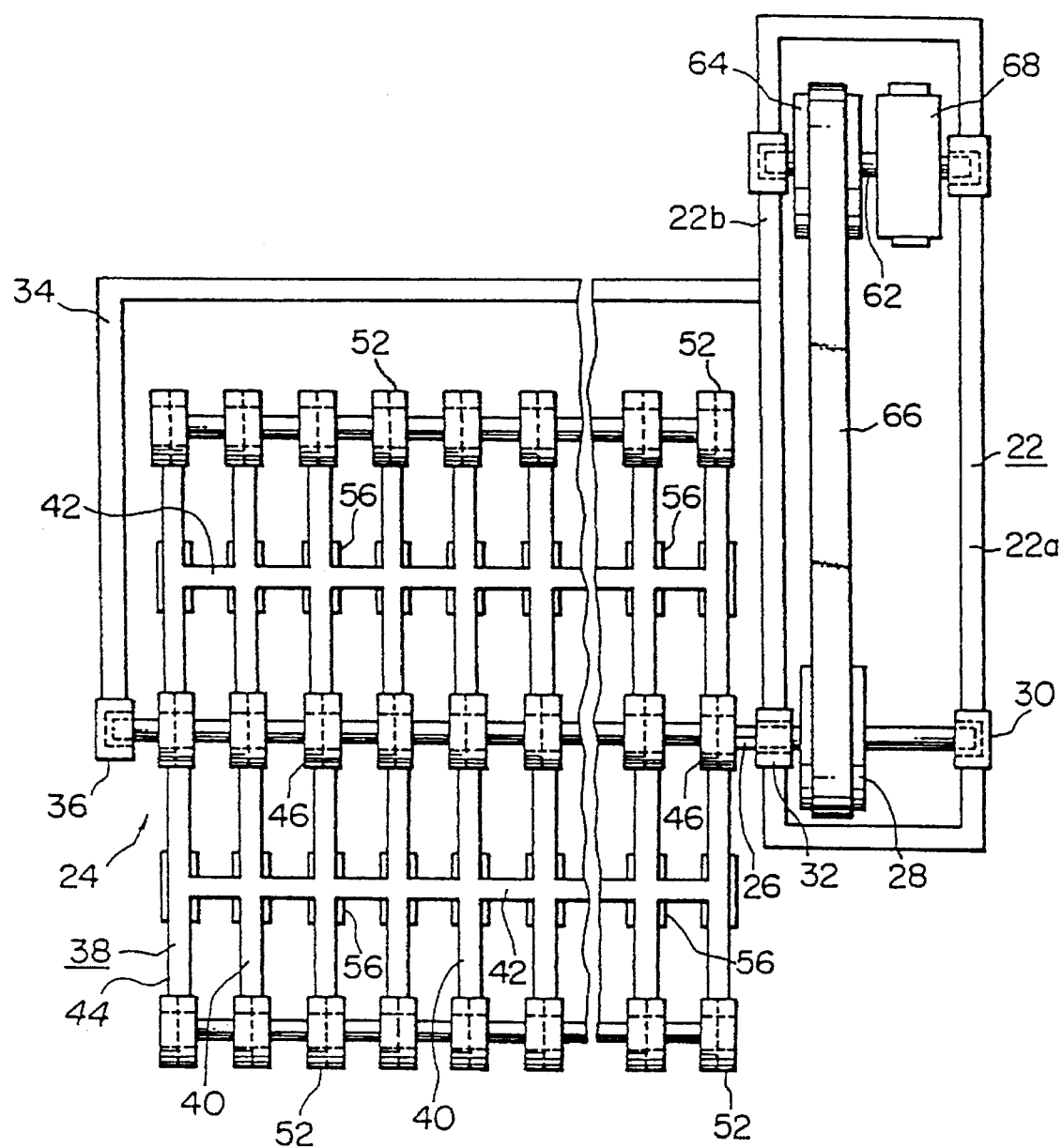
FIG. 4 is a schematic fragmentary sectional top plan view illustrating the main portion of an embodiment of the apparatus for vapor-drying wafers according to the present invention.

A wafer holder 24 is secured rotatably to the fore end of the lower horizontal arm 22. The wafer holder 24 has a main shaft 26, which is the same with the shaft of a first pulley 28, and which is in turn secured to the fore end portion of the cavity within the lower horizontal arm 22 above-mentioned (FIG. 4). The main shaft 26 is rotatably supported by a bearing 36 secured at the free end of a square bend supporting arm 34 extending from the outside face of the inward wall 22b of the lower horizontal arm 22 and bearings 30 and 32 disposed respectively in the outward wall 22a and inward wall 22b of the lower horizontal arm 22.

The reference numeral 38 indicates a wafer holding structure attached to the main shaft 26 and the holding structure 38 has a structure that groups of a plurality of supporting angles 40 are connected with each other by respective connecting rods 42. The holding angles 40 include supporting rods 44, in the central portion of which the above-mentioned main shaft 26 is inserted within the bulks thereof. The supporting rods include further upper surface central receivers 46 and lower surface central receivers 48 (FIG. 6) on the upper surface of the central portion and on the lower surface thereof respectively.

Figure 6:
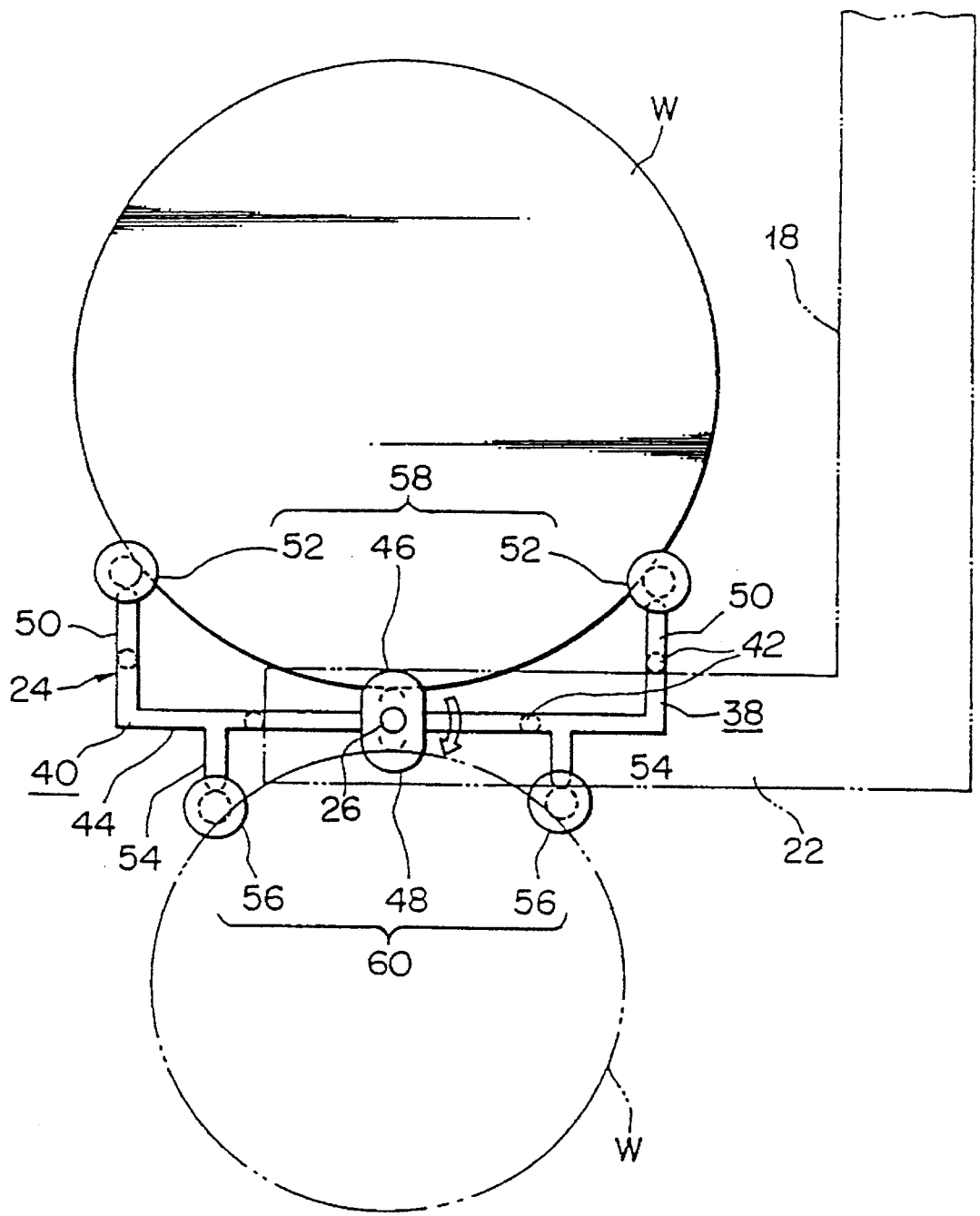
FIG. 6 is a schematic illustrative side elevational view showing the main portion of an embodiment of the apparatus for vapor-drying wafers according to the present invention.

At both ends of the supporting rods 44 of the supporting angles 40 are there provided projecting rods 50 extending upwardly, at the free ends of which upper surface fore end receivers 52 are mounted (FIG. 6). Further around the mid-point between the central portion of the supporting rods 44 of the supporting angles 40 and the both ends of the supporting rods 44 are there provided depending rods 54 depending downwardly, at the free ends of which lower surface fore end receivers 56 are mounted.

Upper surface receiver complexes 58 are composed of the upper surface central receivers 46 and the upper surface fore end receiver 52 and on the other hand lower surface receiver complexes 60 are composed of the lower surface central receivers 48 and the lower surface fore end receivers 56. The upper surface receiver complexes 58 may hold 8-inch wafers W and the lower surface complexes 60 may be designed for holding 6-inch wafers W.

The wafer holder 24 is preferably designed into the shape of a lattice as is above-mentioned so as to let IPA vapor effectively be supplied to any of wafers to be dried, which however does not necessarily mean that the shape has to be restrictive to the one illustrated. Further, the shapes of the receivers 46, 48, 52 and 56 are only required not to cause mechanical damage to the edge portions of wafers and to be designed such that wafers being held do not contact with each other by slanting themselves by chance and therefore are not limited to the example as shown in the figure.

Figure 7:
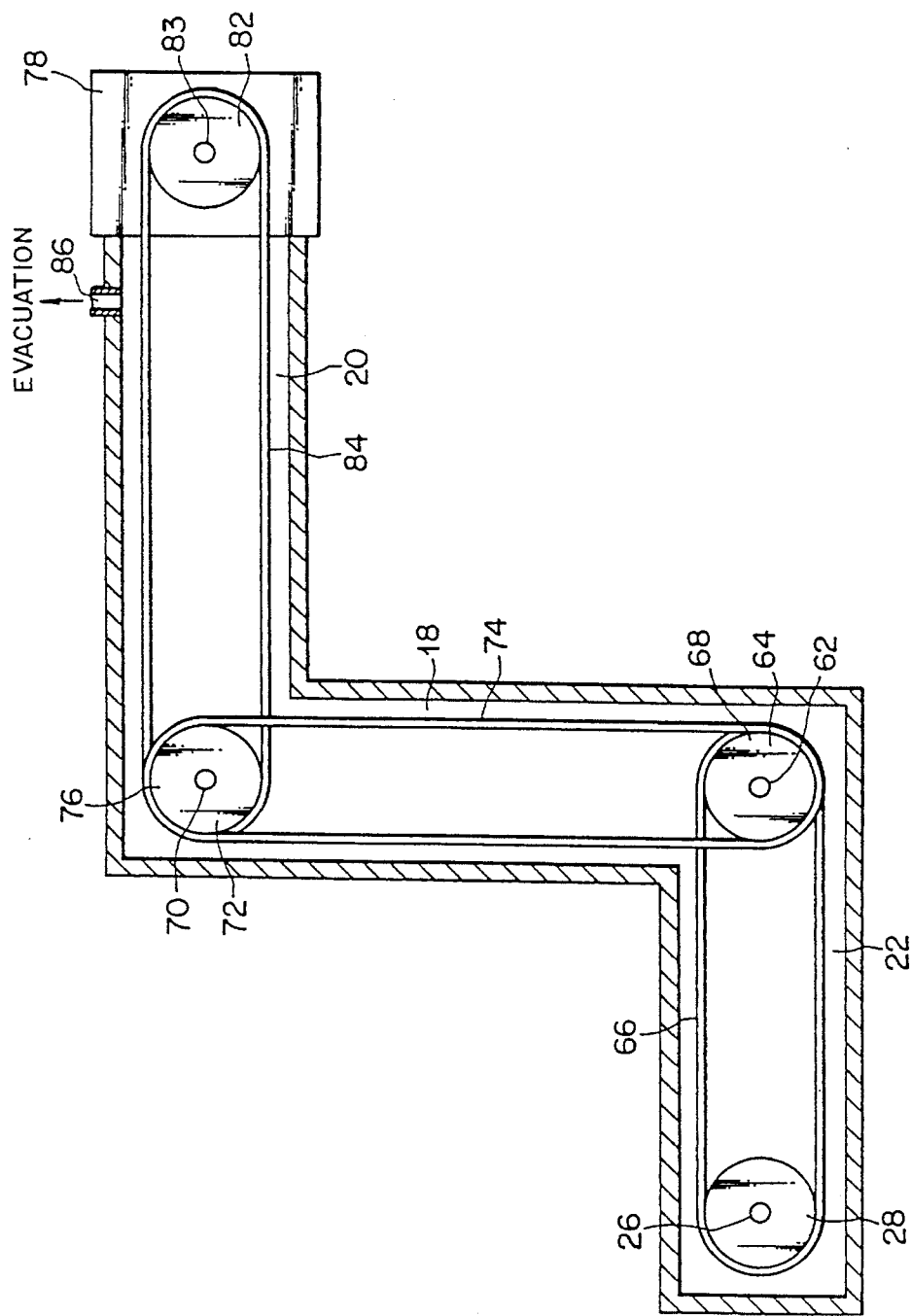
FIG. 7 is a schematic illustrative sectional view showing an embodiment of the robot arm for drying according to the present invention.

The reference numeral 62 indicates a pulley shaft which is disposed in the rear portion of the cavity of the lower horizontal arm 22 and a second pulley 64 is mounted on the pulley shaft 62, where the second pulley 64 corresponds to the afore-mentioned first pulley 28 (FIG. 4 and FIG. 7). The first pulley 28 and the second pulley 64 are coupled by a first pulley belt 66.

A third pulley 68 is mounted on the pulley shaft 62, where the third pulley 68 shares a shaft in common with the second pulley 64. The reference numeral 70 (FIG. 5) indicates a pulley shaft disposed in the upper portion of the cavity of the vertical arm 18 and the pulley shaft 70 has a fourth pulley 72 aligned with the third pulley 68 mounted thereon. A second pulley belt 74 passes around the third and fourth pulleys 68 and 72.

Figure 5:
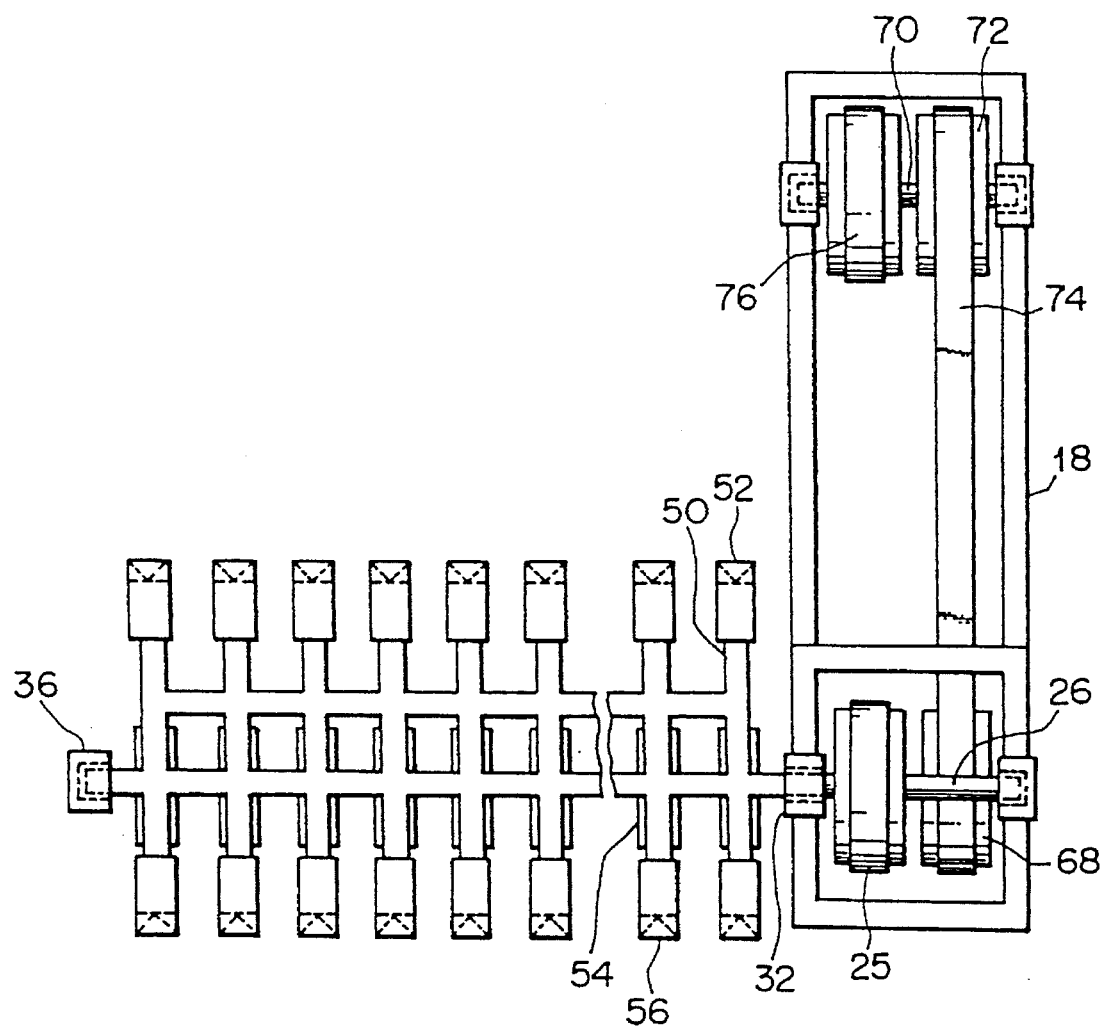
FIG. 5 is a schematic fragmentary sectional front elevational view illustrating the main portion of the apparatus for vapor-drying wafers according to the present invention.

A fifth pulley 76 is mounted on the pulley shaft 70, where the fifth pulley 76 shares a shaft in common with the fourth pulley (FIG. 5 and FIG. 7). The reference numeral 78 indicates a motor disposed at the back of the rear end of the cavity of the upper horizontal arm 20 and the drive shaft 83 of the motor 78 has a sixth pulley 82 fixed thereon, which corresponds to the fifth pulley 76. The fifth pulley 76 and sixth pulley 82 are passed around by a third belt 84 (FIG. 7).

The pulleys 28, 64, 68, 72, 76 and 82, and the pulley belts 66, 74 and 84 as a whole comprise the rotational mechanism of the wafer holder 24. The pulleys and belts are activated by energizing the motor 78 and the main shaft 26 is forced to rotate by the rotation of the first pulley 28 activated in the final stage of the chain of the rotational mechanism, when the wafer holder 24 is at the same time rotated so as to interchange relative positions of the upper surface receiver complex 58 and lower surface receiver complex 60.

A vent 86 is arranged to open in the upper side wall of the upper horizontal arm 20 in order to eliminate the influence of dust generation caused by the activation of the rotational mechanism of the wafer holder 24 and a system is adopted that the air inside the robot arm for drying 16 is evacuated through the vent 86.

With the afore-mentioned organization, the robot arm for transportation of wafers H moves along the front of the IPA vapor-drying apparatus 2 while carrying 8-inch wafers W thereon and transfers the wafers W in a cassette-less mode to the robot arm 16 of the vapor-drying apparatus 2. The robot arm 16 goes down after receiving the 8-inch wafers W and the 8-inch wafers W are then left in the IPA vapor bath 10 built in the IPA vapor-drying apparatus 2 for a predetermined period of time to dry the 8-inch wafers W.

When the wafers are finished with drying, the robot arm 16 begins to go up and transfers the dried wafers W to the robot arm for transportation of wafers H. The robot arm for transportation of wafers H again transfers the received 8-inch wafers W to the following step.

In the case that wafers of different diameters are to be handled, for example, if 8-inch wafers and 6-inch wafers, are to be interchanged on the same wafer holder 24 in handling by the IPA vapor-drying apparatus 2, the wafer holder 24 secured to the fore end of the robot arm 16 is rotated by the rotational mechanism of the wafer holder 24 and thus the upper surface receiver complex 58 (for example, for holding 8-inch wafers) and the lower surface receiver complex 60 (for example, for holding 6-inch wafers) are interchanged in regard to their positions relative each other, so that the wafer holding means for 6-inch wafers is brought to a position for drying the wafers of 6-inch diameter as described above.

In the above-mentioned embodiment, the upper surface receiver complex 58 holds 8-inch wafers and the lower surface receiver complex 60 is to hold 6-inch wafers. That is, a case has been explained that wafers of two different diameters are to be held on the same and one wafer holder 24. Further wafers of three or more different diameters may be held on the same wafer holder 24. The organization for wafers of three diameters are shown in FIGS. 8 and 9.

Figure 8:
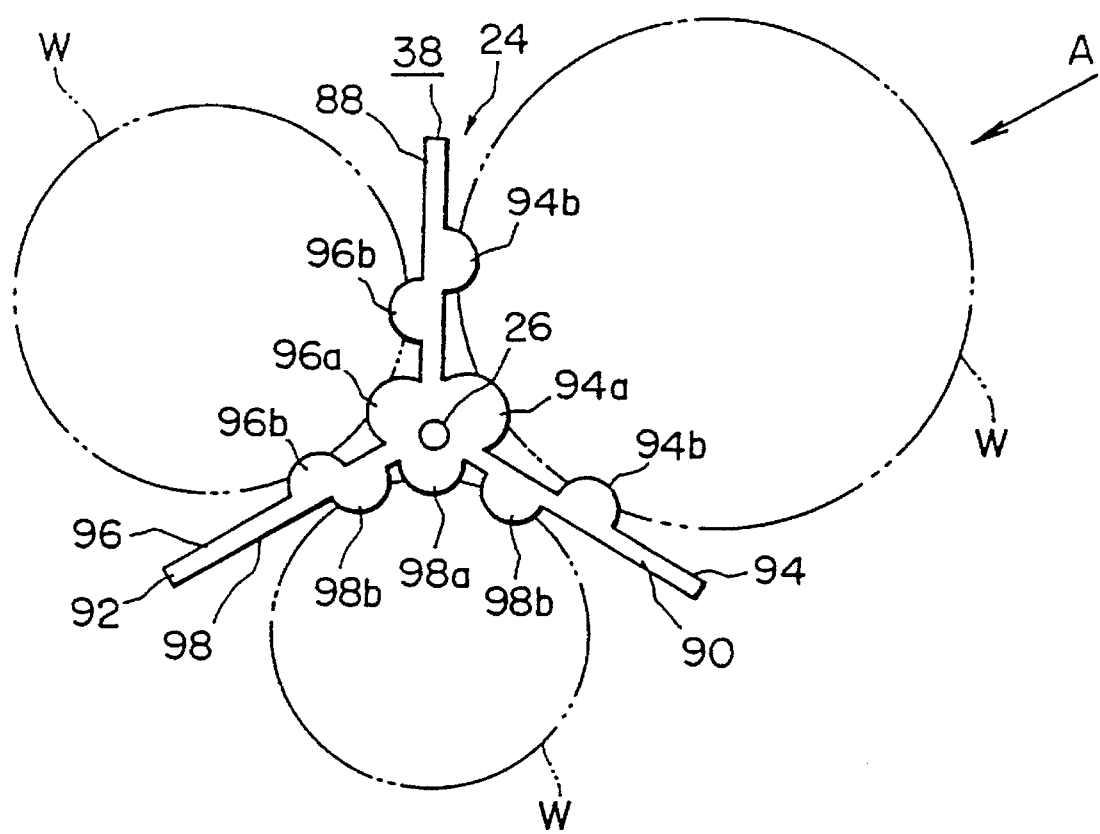
FIG. 8 is a schematic illustrative side elevational view showing another embodiment of the wafer holder used in the apparatus for vapor-drying wafers according to the present invention.
Figure 9:
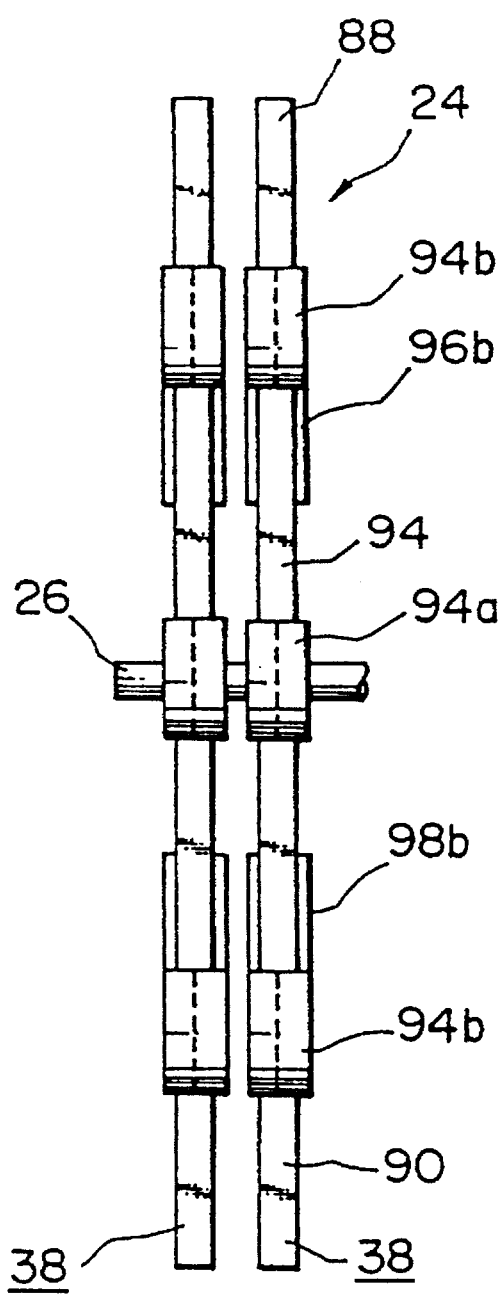
FIG. 9 is a view taken in the direction of the arrow A of FIG. 8.

In FIG. 8, the wafer holder 24 has a wafer holding structure 38 including three supporting strips 88, 90 and 92 in one united body, each outwardly extending from the center and equiangularly separated at angular intervals of 120°. The holding structure 38 is composed of a large receiver complex 94 including the supporting strips 88 and 90, a medium receiver complex 96 including the supporting strips 88 and 92 and a small receiver complex 98 including the supporting strips 90 and 92.

The large receiver complex 94, which for example, holds 8-inch wafers, is composed of a central receiver 94a and side receivers 94b. The medium receiver complex 96, which for example, holds 6-inch wafers, is composed of a central receiver 96a and side receivers 96b. The small receiver complex 98, which for example, holds 5-inch, is composed of a central receiver 98a and side receivers 98b. The reference numeral 26 indicates a main shaft 26 rotatively supporting the wafer holding structure 38.

With a rotational structure similar to the aforementioned embodiment, this three-different-diameter embodiment is organized such that the main shaft 26 rotates and thereby the wafer holder 24 rotates, so that the receiver complexes are interchanged in position among the receiver complexes 94, 96 and 98 for drying wafers of another diameter.

The above-mentioned embodiments show the cases where the wafer holder according to the preset invention is applied to a vapor-drying apparatus. However, the wafer holder according to the present invention is also applicable to cleaning apparatuses and other apparatuses for handling wafers.

What is claimed is:

1. A wafer holder having a plurality of wafer holding means united fixedly in one body rotatably secured onto a robot arm for drying, each said wafer holding means being adapted for holding one or more wafers of a selected diameter vertically supported in a stable manner, said selected diameter being chosen from a number and combination of different diameters, and means for allowing rotation of said wafer holder having said plurality of wafer holding means as a whole about an axis.

2. A wafer holder as set forth in claim 1, wherein said selected diameter is one of a first diameter and a second diameter held by either a first wafer holding means or a second wafer holding means, respectively, of said wafer holder.

3. A wafer holder as set forth in claim 2, wherein the first wafer holding means and second wafer holding means comprises: a plurality of supporting angles interconnected with each other by supporting rods; a main shaft inserted through the supporting rods of the supporting angles in the central portions thereof; an upper surface central receiver disposed at a central portion of a surface of the supporting rods; upper surface fore end receivers mounted at free ends of projecting rods extending from ends of the supporting rods; lower surface central receiver disposed at the central portion of the surface of the supporting rods; lower surface fore end receivers mounted at the free ends of depending rods depending at respective points between the center and ends of the supporting rods.

4. A wafer holder as set forth in claim 2 wherein the robot arm for drying comprises: a plurality of square bends in itself; a cavity in itself sealed by the outside shell except a small vent; a plurality of pulleys, pairs of which have the shafts in common with each other; a plurality of belts passed around the pulleys; and a motor for driving the pulleys attached at the outside of the upper rear end of the arm for drying.

5. A wafer holder as set forth in claim 1, wherein said selected diameter is one of a first diameter, a second diameter and a third diameter held by either a first wafer holding means, a second wafer holding means or a third wafer holding means, respectively, of said wafer holder.

6. A wafer holder as set forth in claim 5, wherein the first wafer holding means, second wafer holding means and third wafer holding means comprises: three supporting strips united in one body at one end of each said supporting strip and extending outwardly from a center, said supporting strips being equiangularly separated at angular intervals of 120°; central receivers and side receivers in three receiver complexes accommodating wafers of respective three different diameters on surfaces of said three supporting strips united in one body.

7. A wafer holder as set forth in claim 5 wherein the robot arm for drying comprises: a plurality of square bends in itself; a cavity in itself sealed by an outside shell except a small vent; a plurality of pulleys, pairs of which have shafts in common with each other; a plurality of belts passed around the pulleys; and a motor for driving the pulleys attached outside of the robot arm for drying.

8. A wafer holder as set forth in claim 1 wherein the robot arm for drying comprises: a plurality of square bends in itself; a cavity in itself sealed by the outside shell except a small vent; a plurality of pulleys, pairs of which have the shafts in common with each other; a plurality of belts passed around the pulleys; and a motor for driving the pulleys attached at the outside of the upper rear end of the arm for drying.

9. An apparatus for vapor-drying wafers that is used to dry wafers dried in an apparatus for drying wafers with vapors generated from a solvent by heating comprising:

a vapor-drying bath;

a robot arm, said robot arm being shiftable upwardly or downwardly mounted above the vapor-drying bath for drying wafers; and a wafer holder having a plurality of wafer holding means united fixedly in one body rotatably secured onto the fore end of the robot arm, each said wafer holding means being adapted for holding one or more wafers of a selected diameter vertically supported in a stable manner, said selected diameter being chosen from a number and combination of different diameters, where diameters held by the wafer holder are changeable to select a diameter thereof to be held by rotating the wafer holder having said wafer holding means as a whole in dependence on the selected diameter of the wafers.

10. A wafer holder as set forth in claim 9, wherein said selected diameter is one of a first diameter and a second diameter held by either a first wafer holding means or a second wafer holding means, respectively, of said wafer holder.

11. An apparatus for vapor-drying wafers as set forth in claim 10, wherein the solvent is isopropyl alcohol.

12. An apparatus for vapor-drying wafers as set forth in claim 10 wherein the robot arm for drying comprises: a plurality of square bends in itself; a cavity in itself sealed by an outside shell except a small vent; a plurality of pulleys, pairs of which have shafts in common with each other; a plurality of belts passed around the pulleys; and a motor for driving the pulleys attached outside of the robot arm for drying.

13. A wafer holder as set forth in claim 9, wherein said selected diameter is one of a first diameter, a second diameter and a third diameter held by either a first wafer holding means, a second wafer holding means or a third wafer holding means, respectively, of said wafer holder.

14. An apparatus for vapor-drying wafers as set forth in claim 13, wherein the solvent is isopropyl alcohol.

15. An apparatus for vapor-drying wafers as set forth in claim 13 wherein the robot arm for drying comprises: a plurality of square bends in itself; a cavity in itself sealed by an outside shell except a small vent; a plurality of pulleys, pairs of which have shafts in common with each other; a plurality of belts passed around the pulleys; and a motor for driving the pulleys attached outside of the robot arm for drying.

16. An apparatus for vapor-drying wafers as set fourth in claim 9, wherein the solvent is isopropyl alcohol.

17. An apparatus for vapor-drying wafers as set forth in claim 9 wherein the robot arm for drying comprises: a plurality of square bends in itself; a cavity in itself sealed by an outside shell except a small vent; a plurality of pulleys, pairs of which have shafts in common with each other; a plurality of belts passed around the pulleys; and a motor for driving the pulleys attached outside of the robot arm for drying.

* * * * *